US012725240B2

(12) United States Patent
Kaneko et al.

(10) Patent No.: US 12,725,240 B2
(45) Date of Patent: Sep. 1, 2026

(54) HEAT TREATMENT ENVIRONMENT EVALUATION METHOD AND SILICON CARBIDE SUBSTRATE

(71) Applicants: KWANSEI GAKUIN EDUCATIONAL FOUNDATION, Hyogo (JP); TOYOTA TSUSHO CORPORATION, Nagoya (JP)

(72) Inventors: Tadaaki Kaneko, Sanda (JP); Daichi Dojima, Sanda (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 544 days.

(21) Appl. No.: 18/250,710

(22) PCT Filed: Oct. 27, 2021

(86) PCT No.: PCT/JP2021/039699
§ 371 (c)(1),
(2) Date: Apr. 26, 2023

(87) PCT Pub. No.: WO2022/092166
PCT Pub. Date: May 5, 2022

(65) Prior Publication Data

US 2024/0020814 A1 Jan. 18, 2024

(30) Foreign Application Priority Data

Oct. 28, 2020 (JP) ................................ 2020-180971

(51) Int. Cl.

| | |
|---|---|
| ***G06T 7/00*** | (2017.01) |
| ***H10P 14/20*** | (2026.01) |
| ***H10P 50/00*** | (2026.01) |

(52) U.S. Cl.
CPC ........ *G06T 7/0004* (2013.01); *H10P 14/2904* (2026.01); *H10P 14/2926* (2026.01); *H10P 50/00* (2026.01); *G06T 2207/30148* (2013.01)

(58) Field of Classification Search
CPC ............. G06T 7/0004; H01L 21/02378; H01L 21/02433; G01N 23/2251; C30B 33/12; C30B 29/36
See application file for complete search history.

(56) References Cited

U.S. PATENT DOCUMENTS

2017/0121848 A1 5/2017 Torimi et al.
2019/0136411 A1* 5/2019 Kaneko ............ H01L 21/02658
(Continued)

FOREIGN PATENT DOCUMENTS

EP 3451362 A1 3/2019
JP 2011-049496 A 3/2011
(Continued)

OTHER PUBLICATIONS

English Translation of International Search Report from PCT/JP2021/039699 dated Dec. 28, 2021 (2 pages).
(Continued)

*Primary Examiner* — Hwa Andrew Lee
(74) *Attorney, Agent, or Firm* — Calfee, Halter & Griswold LLP

(57) ABSTRACT

An object of the present invention is to provide a novel technique for evaluating a heat treatment environment. The present invention is a method for evaluating a heat treatment environment, the method comprising an image acquisition step of acquiring an image by making an electron beam incident at an incident angle inclined with respect to a normal line of a {0001} plane of a heat-treated silicon carbide substrate and an environment evaluation step of evaluating a heat treatment environment of the silicon
(Continued)

carbide substrate on a basis of on contrast information of the image.

11 Claims, 9 Drawing Sheets

(56) References Cited

U.S. PATENT DOCUMENTS

| | | | |
|---|---|---|---|
| 2020/0279714 | A1 | 9/2020 | Ogata et al. |
| 2021/0398807 | A1 | 12/2021 | Kaneko et al. |
| 2021/0399095 | A1 | 12/2021 | Kaneko et al. |

FOREIGN PATENT DOCUMENTS

| | | | |
|---|---|---|---|
| JP | 2015179082 | A | 10/2015 |
| WO | 2015/151413 | A1 | 10/2015 |
| WO | 2016/079984 | A1 | 5/2016 |
| WO | 2017/188382 | A1 | 11/2017 |
| WO | 2019/058440 | A1 | 3/2019 |
| WO | 2020095872 | A1 | 5/2020 |
| WO | 2020095873 | A1 | 5/2020 |

OTHER PUBLICATIONS

EPO Communication and European Search Report from EP Application No. 21886283.7 dated Jun. 17, 2024 (10 pages).

* cited by examiner (a)

(b)

(a)

<11-20>
<1-100>
[0001]
[11-20]
[01-10]
[10-10]
[-12-10]
[2-1-10]
[-1100]
[1-100]
[-2110]
[1-210]
[-1010]
[0-110]
[-1-120]

(b)

(a)

(b)

(a)

(b)

(a)

(b)

HEAT TREATMENT ENVIRONMENT EVALUATION METHOD AND SILICON CARBIDE SUBSTRATE

CROSS-REFERENCE TO RELATED APPLICATIONS

This application is a 371 of PCT Application No. PCT/JP2021/039699, filed Oct. 27, 2021, which claims priority to Japanese Application No. 2020-180971, filed on Oct. 28, 2020, the contents of which are hereby incorporated by reference as if recited in their entirety.

TECHNICAL FIELD

The present invention relates to a method for evaluating a heat treatment environment and relates to a silicon carbide substrate.

BACKGROUND ART

Silicon carbide (SiC) semiconductor devices have higher withstand voltage and are capable of operating at higher efficiency and higher temperature than silicon (Si) and gallium arsenide (GaAs) semiconductor devices. Therefore, the SiC semiconductor devices have been developed for industrialization.

In order to improve the yield and quality of the SiC semiconductor devices, a method for controlling a step-terrace structure of a SiC substrate has been proposed (see Patent Literature 1 and Patent Literature 2).

For example, Patent Literature 1 describes a technique of a method of manufacturing a SiC epitaxial wafer in which a surface pattern of a SiC substrate is controlled by using a C/Si concentration ratio of $SiH_4$ gas and $C_3H_8$ gas simultaneously supplied to the SiC substrate.

In addition, Patent Literature 2 describes a technique of a surface treatment method of a SiC substrate in which the SiC substrate is etched while an etching mode that is determined on the basis of at least a rate of etching, and a depth of etching are controlled, so that a surface pattern of the SiC substrate after etching is controlled.

CITATION LIST

Patent Literature

Patent Literature 1: JP 2011-49496 A
Patent Literature 2: JP 2016/079984 A

SUMMARY OF INVENTION

Technical Problem

A step-terrace structure of a heat-treated SiC substrate is determined by an environment of heat treatment (hereinafter, referred to as a heat treatment environment.) experienced by the SiC substrate. Therefore, whether a desired step-terrace structure can be repeatedly reproduced depends on whether a desired heat treatment environment can be reproduced.

Since the semiconductor substrate is heat-treated at a high temperature of one thousand and several hundred degrees or more, it is difficult to directly evaluate this heat treatment environment. Therefore, the heat treatment environment has been indirectly evaluated by associating heat treatment conditions (a concentration ratio of source gas, a heating temperature, a growth rate, an etching rate, and the like) with the step-terrace structure (an AFM image and the like) obtained after the heat treatment (see Patent Literature 1 and Patent Literature 2).

However, it is known that the step-terrace structure after the heat treatment is affected by crystal defects inherent in the SiC substrate and a subsurface damaged layer introduced during substrate processing. Therefore, there is a problem in that it is not easy to appropriately evaluate the heat treatment environment.

In view of the above-described problems, an object of the present invention is to provide a novel technique for evaluating a heat treatment environment.

Solution to Problem

To achieve the above-described object, the present invention is a method for evaluating a heat treatment environment, the method including:

an image acquisition step of acquiring an image by making an electron beam incident at an incident angle inclined with respect to a normal line of a {0001} plane of a heat-treated silicon carbide substrate; and an environment evaluation step of evaluating a heat treatment environment of the silicon carbide substrate on the basis of contrast information of the image.

As described above, by evaluating the heat treatment environment on the basis of the contrast information of the image obtained from the silicon carbide substrate, it is possible to evaluate the heat treatment environment experienced by the silicon carbide substrate appropriately.

In the present specification, the notation "—" for Miller indices means a bar attached to an index immediately after the notation "—".

In a preferred mode of the present invention, the environment evaluation step is a step of evaluating the contrast information appearing on a terrace of the silicon carbide substrate.

In a preferred mode of the present invention, the environment evaluation step is a step of evaluating the contrast information appearing along a <1-100> direction.

In a preferred mode of the present invention, the contrast information includes a plurality of pieces of brightness information reflecting a stacking direction of atoms, and the environment evaluation step includes a brightness comparison step of comparing the plurality of pieces of brightness information.

In a preferred mode of the present invention, the contrast information includes first brightness information reflecting the stacking direction of atoms and second brightness information capable of being compared with the first brightness information, and the environment evaluation step includes the brightness comparison step of comparing the first brightness information with the second brightness information.

In a preferred mode of the present invention, the image acquisition step is a step of making the electron beam incident on the silicon carbide substrate, the electron beam being inclined to the <1-100> direction.

In a preferred mode of the present invention, the environment evaluation step is a step of evaluating that the heat treatment environment is a Si—SiC equilibrium vapor pressure environment or a C—SiC equilibrium vapor pressure environment.

In a preferred mode of the present invention, the environment evaluation step is a step of evaluating that the heat treatment environment is a Si-rich environment or a C-rich environment.

In a preferred mode of the present invention, the silicon carbide substrate has a hexagonal crystal structure.

A preferred mode of the present invention includes a heat treatment step of forming a step-terrace structure by heat-treating the silicon carbide substrate in the heat treatment environment.

In a preferred mode of the present invention, the silicon carbide substrate includes a step formation portion that serves as a generation source of a step during heat treatment, and an environment evaluation area where the step-terrace structure resulting from the step formation portion is formed, and the environment evaluation step is a step of evaluating the environment evaluation area.

In a preferred mode of the present invention, the step formation portion is a threading dislocation.

In a preferred mode of the present invention, the step formation portion is a machined hole.

In a preferred mode of the present invention, the environment evaluation area is a machined recess.

The present invention also relates to a silicon carbide substrate. That is, to achieve the above-described object, the present invention is a silicon carbide substrate including: a step formation portion that serves as a generation source of a step during heat treatment; and an environment evaluation area where a step-terrace structure resulting from the step formation portion is formed.

In a preferred mode of the present invention, the step formation portion is a threading dislocation.

In a preferred mode of the present invention, the step formation portion is a machined hole.

In a preferred mode of the present invention, the environment evaluation area is a machined recess.

Advantageous Effects of Invention

According to the disclosed technique, it is possible to provide the novel technique for evaluating a heat treatment environment.

Other objects, features, and advantages will become apparent from reading the following description of embodiments when taken in conjunction with the drawings and the claims.

DESCRIPTION OF EMBODIMENTS

Figure 1:
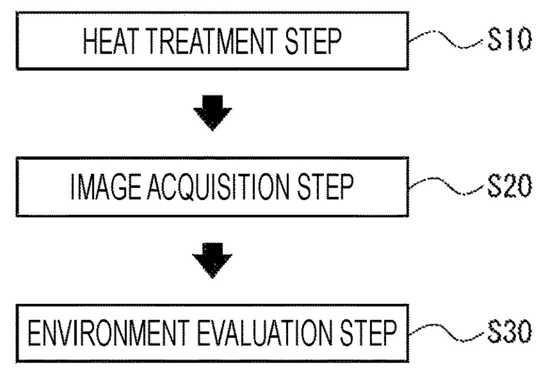
FIG. 1 is an overview diagram illustrating respective steps of a method for evaluating a heat treatment environment according to an embodiment.

Hereinafter, preferred embodiments of a method for evaluating a heat treatment environment and a SiC substrate according to the present invention will be described in detail with reference to the accompanying drawings. The technical scope of the present invention is not limited to the embodiments illustrated in the accompanying drawings, and can be appropriately changed within the scope described in the claims. In the following description of the embodiments and the accompanying drawings, the same reference numerals are given to the same components, and redundant description is omitted.

<<Method for Evaluating Heat Treatment Environment>>

FIG. 1 is an overview diagram illustrating steps of the method for evaluating a heat treatment environment according to an embodiment of the present invention. The method for evaluating a heat treatment environment according to the embodiment includes a heat treatment step S10 of forming a step-terrace structure by heat-treating a hexagonal SiC substrate 10 in a heat treatment environment HE, an image acquisition step S20 of acquiring an image I by making an electron beam PE incident at an incident angle θ inclined with respect to a normal line N of a {0001} plane of the heat-treated SiC substrate 10, and an environment evaluation step S30 of evaluating the heat treatment environment HE of the SiC substrate 10 on the basis of contrast information C of the image I.

The method for evaluating a heat treatment environment according to the present invention is characterized in that the heat treatment environment HE at the heat treatment step S10 is evaluated on the basis of the contrast information C of the image I acquired using the electron beam PE incident from a direction inclined with respect to the normal line N of the SiC substrate 10.

Specifically, by acquiring the image I including a plurality of pieces of brightness information (the contrast information C) reflecting a stacking direction of atoms on a surface of the SiC substrate 10 by the electron beam PE, and comparing the plurality of pieces of brightness information appearing in the image I, it is possible to specify the heat treatment environment HE experienced by the SiC substrate 10.

As a result, the heat treatment environment HE experienced by the SiC substrate 10 can be evaluated to be a Si—SiC equilibrium vapor pressure environment or a C—SiC equilibrium vapor pressure environment. In addition, the heat treatment environment HE experienced by the SiC substrate 10 can be evaluated to be a Si-rich environment or a C-rich environment.

The "SiC—Si vapor pressure environment" in the present specification refers to a vapor pressure environment when SiC (solid phase) and Si (liquid phase) are in a state of phase equilibrium via a gas phase. This SiC—Si equilibrium vapor pressure environment is formed, for example, by heat-treating a semi-closed space in which an atomic ratio Si/C exceeds 1.

Specifically, in a case where a SiC substrate satisfying a stoichiometric ratio 1:1 and a Si-vapor supply source (a Si substrate, a Si pellet, or the like) are disposed in a SiC container satisfying a stoichiometric ratio 1:1, the atomic ratio Si/C in the container exceeds 1. By heating the container disposed in this manner, the SiC—Si vapor pressure environment can be formed in the container.

The "SiC—C equilibrium vapor pressure environment" in the present specification refers to a vapor pressure environment when SiC (solid phase) and C (solid phase) are in a state of phase equilibrium via a gas phase. This SiC—C equilibrium vapor pressure environment is formed, for example, by heat-treating a semi-closed space in which an atomic ratio Si/C is equal to or less than 1.

Specifically, in a case where a SiC substrate satisfying a stoichiometric ratio 1:1 is disposed in a SiC container satisfying a stoichiometric ratio 1:1, the atomic ratio Si/C in the container becomes 1. Furthermore, a C-vapor supply source (a C pellet or the like) may be disposed to make the atomic ratio Si/C equal to or less than 1. By heating the container disposed in this manner, the SiC—C vapor pressure environment can be formed in the container.

The SiC—Si equilibrium vapor pressure environment and the SiC—C equilibrium vapor pressure environment in the present specification include a near-thermal equilibrium vapor pressure environment that satisfies a relationship between a growth rate and a growth temperature derived from a theoretical thermal equilibrium environment.

In the present specification, the "semi-closed space" refers to a space in which the inside of the container can be evacuated while at least a part of vapor generated in the container can be confined. The semi-closed space can be formed in the container.

In the method for evaluating a heat treatment environment according to the present invention, the heat treatment environment HE experienced by the SiC substrate 10 can be evaluated by evaluating the SiC substrate 10 that has been heat-treated in advance. Therefore, the method for evaluating a heat treatment environment according to the present invention may include at least the image acquisition step S20 and the environment evaluation step S30.

Hereinafter, the steps of the preferred embodiment of the present invention will be described in detail.

<Heat Treatment Step>

The heat treatment step S10 is a step of heat-treating the SiC substrate 10 in the heat treatment environment HE to be evaluated according to the present invention. Specifically, the heat treatment step S10 is a step of forming a step-terrace structure reflecting the heat treatment environment HE by heat-treating the hexagonal SiC substrate 10 in the heat treatment environment HE.

A crystal growth method of forming a growth layer on the SiC substrate 10 and an etching method of etching the SiC substrate 10 can be given as examples of a method of the heat treatment step S10.

Examples of the crystal growth method include a chemical vapor deposition (CVD) method, a physical vapor transport (PVT) method, a metastable solvent epitaxy (MSE) method, and a confined physical vapor transport (CPVT) crystal growth method (see FIG. 2) to be described later.

Examples of the etching method include a hydrogen etching method using hydrogen gas as etching gas, a Si-vapor etching (SiVE) method of performing heating under a Si atmosphere, and a CPVT etching method (see FIG. 3) to be described later.

Hereinafter, the method of the heat treatment step S10 according to the preferred embodiment will be described in detail with reference to FIGS. 2 and 3.

The heat treatment step S10 according to the preferred embodiment is a step of housing the SiC substrate 10 and a SiC material 20 inside a heat treatment container 30, and heating the heat treatment container 30 so as to form a temperature gradient inside the heat treatment container 30. In addition, the heat treatment container 30 is preferably housed in a refractory material container 40.

The present embodiment may include a mode in which the SiC substrate 10 is crystal-grown and a mode in which the SiC substrate 10 is etched, according to a positional relationship between the SiC substrate 10 and the SiC material 20 and a direction of the temperature gradient.

Figure 2:
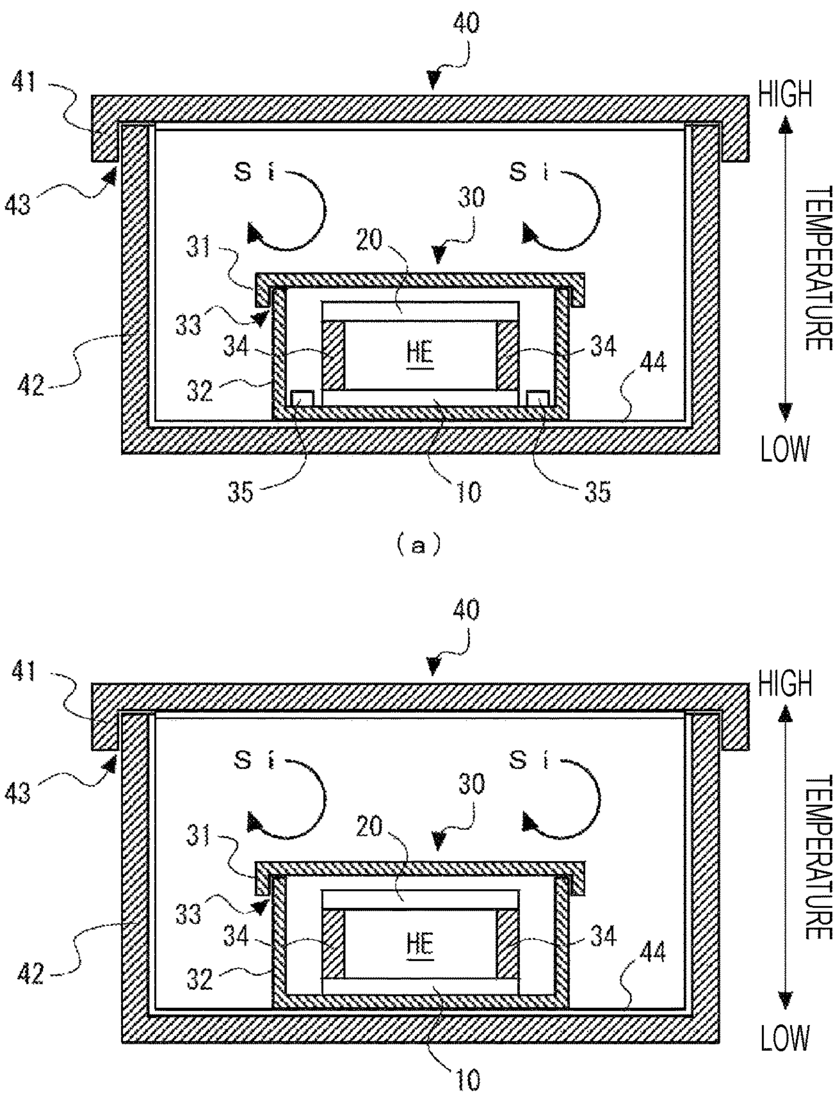
FIG. 2 is a drawing illustrating a heat treatment step according to the embodiment.

FIG. 2 is an explanatory view illustrating a mode in which the SiC substrate 10 is crystal-grown using the CPVT crystal growth method. In this crystal growth mode, the SiC substrate 10 and the SiC material 20 are disposed facing each other, and the heating is performed with such a temperature gradient that the SiC substrate 10 is on the low temperature side and the SiC material 20 is on the high temperature side. With this temperature gradient, a Si element and a C element are transported from the SiC material 20 to the SiC substrate 10, so that a growth layer is grown on the SiC substrate 10.

Figure 3:
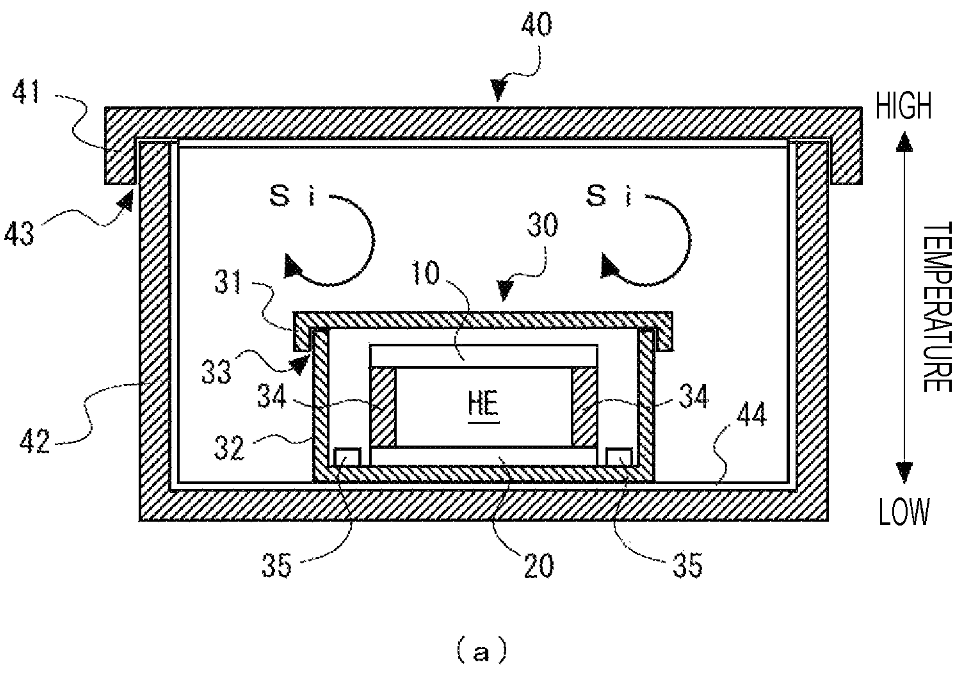
FIG. 3 is a drawing illustrating the heat treatment step according to the embodiment.
Figure 3:
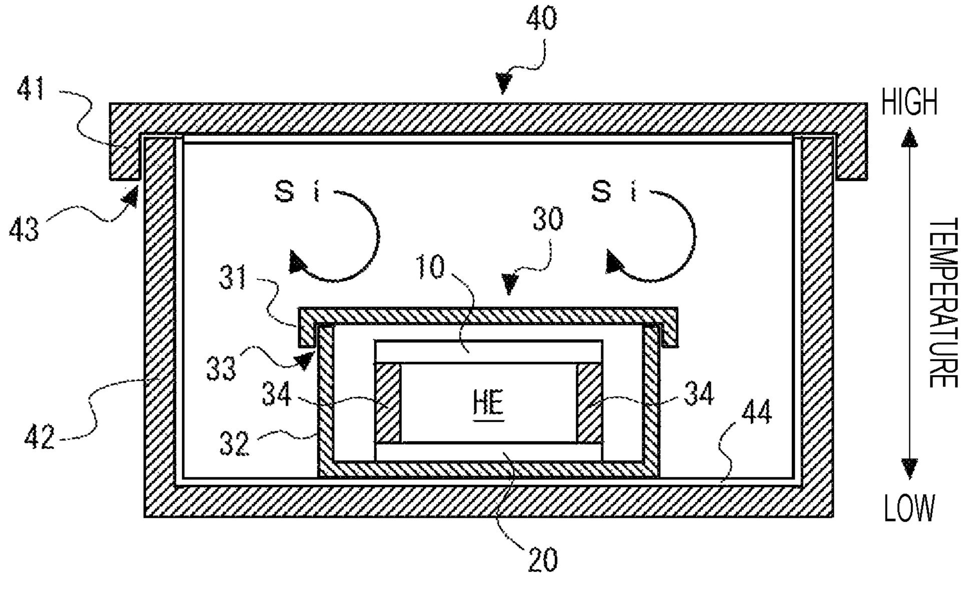

FIG. 3 is an explanatory view illustrating a mode in which the SiC substrate 10 is etched using the CPVT etching method. In this etching mode, the SiC substrate 10 and the SiC material 20 are disposed facing each other, and the heating is performed with such a temperature gradient that the SiC material 20 is on the low temperature side and the SiC substrate 10 is on the high temperature side. With this temperature gradient, a Si element and a C element are transported from the SiC substrate 10 to the SiC material 20, so that the SiC substrate 10 is etched.

FIGS. 2 and 3 are in a relationship in which the positions of the SiC substrate 10 and the SiC material 20 are swapped. In addition, the transporting direction of the Si element and the C element may be reversed by reversing the direction of the temperature gradient without swapping the positions of the SiC substrate 10 and the SiC material 20.

FIGS. 2(*a*) and 3(*a*) illustrate a mode in which the SiC substrate 10 and the SiC material 20 are disposed and heat-treated in the semi-closed space in which the atomic ratio Si/C exceeds 1. As described above, by heat-treating the SiC substrate 10 in the semi-closed space in which the atomic ratio Si/C exceeds 1, the step-terrace structure corresponding to the Si—SiC equilibrium vapor pressure environment (the heat treatment environment HE) is formed on the surface of the SiC substrate 10.

FIGS. 2(*b*) and 3(*b*) illustrate a mode in which the SiC substrate 10 and the SiC material 20 are disposed and heat-treated in the semi-closed space in which the atomic ratio Si/C is equal to or less than 1. As described above, by heat-treating the SiC substrate 10 in the semi-closed space in which the atomic ratio Si/C is equal to or less than 1, the step-terrace structure corresponding to the C—SiC equilibrium vapor pressure environment (the heat treatment environment HE) is formed on the surface of the SiC substrate 10.

Hereinafter, the SiC substrate 10, the SiC material 20, the heat treatment container 30, and the refractory material container 40 at the heat treatment step S10 according to the preferred embodiment will be described in detail.

(SiC Substrate)

A substrate obtained by processing single-crystal SiC into a thin plate shape can be given as an example of the SiC substrate 10. Specifically, a SiC wafer or the like obtained by slicing a SiC ingot produced by a sublimation method or the like into a disk shape can be given as an example. In addition, 200 or more kinds of polytypes of single-crystal SiC have been confirmed, and 4H—SiC and 6H—SiC are known as hexagonal polytypes having a high probability of occurrence and being important for application.

Figure 4:
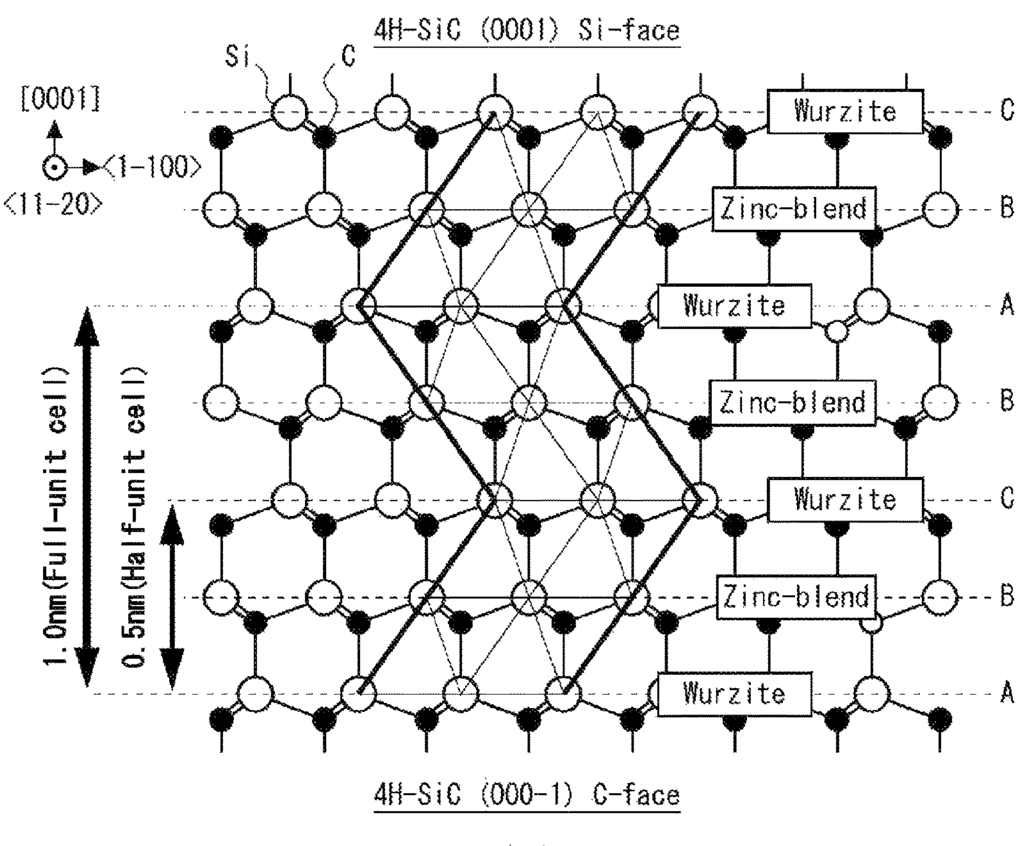
FIG. 4 is a schematic view of a 4H—SiC crystal structure.

FIG. 4 illustrates a schematic view of a 4H—SiC crystal structure. FIG. 4(*a*) is the 4H—SiC crystal structure viewed from a <11-20> direction. FIG. 4(*b*) is the 4H—SiC crystal structure viewed from a direction.

In addition, the notations "A, B, and C" in this drawing mean occupancy positions (corresponding to Si—C pairs) of three kinds of atoms in a hexagonal close-packed structure. In FIG. 4(*a*) illustrating the 4H—SiC crystal structure, the stacked atoms at the A and C positions correspond to a zinc-blende structure, and the stacked atoms at the B position correspond to a wurtzite structure.

Figure 5:
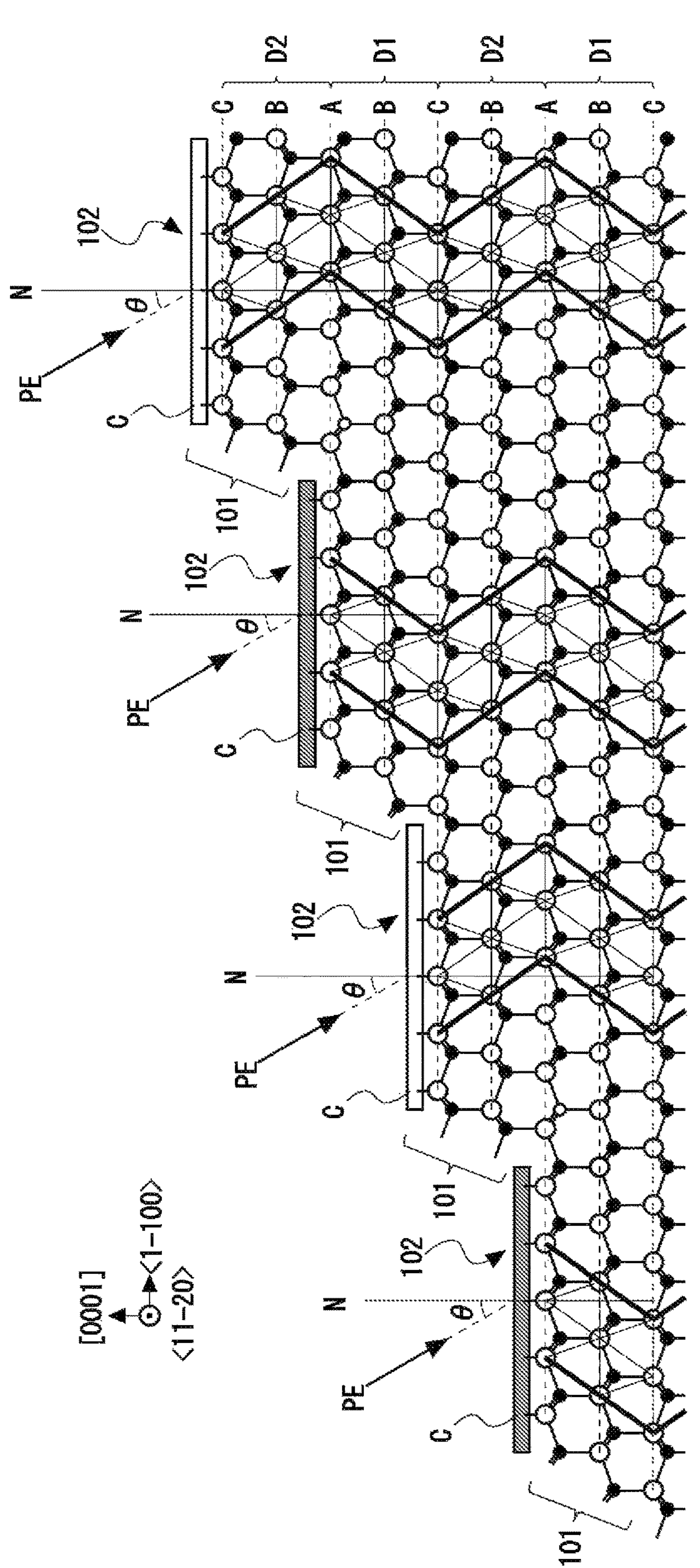
FIG. 5 is a schematic view of the 4H—SiC crystal structure.

FIG. 5 illustrates a schematic view of the step-terrace structure formed on the surface of the SiC substrate 10. This step-terrace structure has a stair structure where a step 101, which is a level difference portion with one or more molecular layers, and a terrace 102, which is a flat portion where the {0001} plane is exposed, are alternately arranged. In the step 101, one molecular layer (0.25 nm) is a minimum height (minimum unit), and a plurality of the molecular layers are stacked to form various step heights. FIG. 5 illustrates the step 101 including the two molecular layers (0.5 nm: half-unit cell) of 4H—SiC.

(SiC Material)

The SiC material 20 includes SiC capable of receiving or transferring the Si element and the C element from or to the SiC substrate 10 by being heated facing the SiC substrate 10. In the embodiment, as illustrated in FIGS. 2 and 3, the SiC substrate 10 and the SiC material 20 as a substrate made of SiC face each other using a holder 34. In addition, for example, a container made of SiC (the heat treatment container 30) or a container partly formed of SiC may be adopted as the SiC material 20. As a crystal polymorph of the SiC material 20, any polytype can be adopted, and polycrystal SiC may be adopted.

(Heat Treatment Container)

The heat treatment container 30 can adopt any desired configuration if it is a configuration in which a vapor pressure of a gas-phase species containing the Si element and a gas-phase species containing the C element in an internal space is generated during the heat treatment. Examples of such a configuration include a configuration in which SiC is exposed on the inner side of the container, and a configuration in which the SiC material (the substrate made of SiC or the like) is separately disposed in the heat treatment container 30. In addition, a mode may be included in which a heat treatment container 30 including a material other than SiC is used to house a material that generates the Si element and the C element inside the container.

In the preferred embodiment, the entire heat treatment container 30 includes polycrystal SiC. By heating the heat treatment container 30 including polycrystal SiC as described above, it is possible to generate an atmosphere containing the Si element and the C element inside the container (the semi-closed space).

It is desirable that the environment in the heat treatment container 30 subjected to the heat treatment is a vapor pressure environment of a mixed system of the gas-phase species containing the Si element and the gas-phase species containing the C element. Examples of the gas-phase species containing the Si element include Si, $Si_2$, $Si_3$, $Si_2C$, $SiC_2$, and SiC. In addition, examples of the gas-phase species containing the C element include $Si_2C$, $SiC_2$, SiC, and C. That is, SiC-based gas is present in the heat treatment container 30.

As illustrated in FIGS. 2 and 3, the heat treatment container 30 is a fitting container including an upper container 31 and a lower container 32 that can be fitted to each other. A minute gap 33 is formed in a fitting portion between the upper container 31 and the lower container 32, so that the inside of the heat treatment container 30 can be exhausted (evacuated) from the gap 33. That is, the inside of the heat treatment container 30 is the semi-closed space.

Furthermore, the heat treatment container 30 may include the holder 34 that holds the SiC substrate 10 or the SiC material 20 in midair. The holder 34 only needs to be able to hold at least a part of the SiC substrate 10 in midair in the heat treatment container 30. For example, any conventional support means, such as a one-point support, a three-point support, a configuration for supporting an outer peripheral edge, and a configuration for clamping a part, can be reasonably adopted. As a material of the holder 34, a refractory material can be adopted.

Note that the holder 34 does not need to be provided depending on the form of the SiC material 20. That is, when the heat treatment container 30 itself is the SiC material 20, the SiC substrate 10 may be disposed on a bottom surface of the lower container 32 (without providing the holder 34).

Furthermore, as illustrated in FIGS. 2(*a*) and 3(*a*), the heat treatment container 30 may include a Si-vapor supply source 35. The Si-vapor supply source 35 only needs to be configured to generate Si vapor in the heat treatment container 30 at the time of heating. Examples of the Si-vapor supply source 35 can include a solid of Si (a piece of single-crystal Si or a Si pellet of Si powder or the like) and a Si compound.

(Refractory Material Container)

The refractory material container 40 can adopt any desired configuration only if it is a configuration in which the heat treatment container 30 is accommodated and a vapor pressure (an atmosphere containing the Si element) of the gas-phase species containing the Si element in an internal space is generated during the heat treatment. The atmosphere containing the Si element in the inside of the refractory material container 40 according to the embodiment is formed using a Si-vapor supply source 44. Note that any desired method capable of forming the atmosphere containing the Si element around the heat treatment container 30 can be reasonably adopted.

The refractory material container 40 includes a refractory material. For example, examples of the refractory material include C, which is a general-purpose heat resistant member, W, Re, Os, Ta, and Mo, which are refractory metals, $Ta_9C_8$, HfC, TaC, NbC, ZrC, $Ta_2C$, TiC, WC, and MoC, which are carbides, HfN, TaN, BN, $Ta_2N$, ZrN, and TiN, which are nitrides, and $HfB_2$, $TaB_2$, $ZrB_2$, $NB_2$, $TiB_2$, and polycrystal SiC, which are borides.

Similarly to the heat treatment container 30, the refractory material container 40 is a fitting container including an upper container 41 and a lower container 42 that can be fitted to each other, and is capable of accommodating the heat treatment container 30. A minute gap 43 is formed in a fitting portion between the upper container 41 and the lower container 42, so that the inside of the refractory material container 40 can be exhausted (evacuated) from the gap 43.

The refractory material container 40 preferably includes the Si-vapor supply source 44 capable of supplying the vapor pressure of the gas-phase species containing the Si element to the inside of the refractory material container 40. The Si-vapor supply source 44 only needs to be configured to generate Si vapor in the inside of the refractory material container 40 at the time of heating. Examples of the Si-vapor supply source 44 include a solid of Si (a piece of single-crystal Si or a Si pellet of Si powder or the like) and a Si compound.

At the heat treatment step S10 according to the embodiment, TaC is used as the material of the refractory material container 40, and tantalum silicide is used as the Si-vapor supply source 44. As illustrated in FIGS. 2 and 3, a tantalum silicide layer is formed on the inner side of the refractory material container 40. The Si vapor is supplied from the tantalum silicide layer into the container at the time of heating, whereby the Si vapor pressure environment is formed.

<Image Acquisition Step>

As illustrated in FIG. 5, the image acquisition step S20 is a step of acquiring the image I including the contrast information C of the terrace 102 reflecting the stacking direction of the atoms on the surface of the SiC substrate 10 by making the electron beam PE incident on the SiC substrate 10 at the incident angle θ inclined with respect to the normal line N of the {0001} plane of the SiC substrate 10.

The image acquisition step S20 includes an installation step S21 of installing the SiC substrate 10 on a stage of a scanning electron microscope, an inclination step S22 of inclining the stage such that the electron beam PE is incident on the SiC substrate 10 at the incident angle θ inclined with respect to the normal line N of the {0001} plane of the SiC substrate 10, and an electron beam irradiation step S23 of irradiating the SiC substrate 10 with the electron beam PE to obtain the image I.

At the inclination step S22, the stage is preferably inclined such that the electron beam PE is inclined to a <1-100> direction with respect to the normal line N of the SiC substrate 10.

An inclination angle φ of the stage at the inclination step S22 is inclined so that the incident angle θ of the electron beam PE is preferably in a range between 22° and 42° inclusive, more preferably in a range between 27° and 37° inclusive, and still more preferably in a range between 30° and 31° inclusive.

In addition, the inclination angle φ of the stage at the inclination step S22 is inclined so that the incident angle θ of the electron beam PE is preferably in a range between 5° and 10° inclusive, more preferably in a range between 7° and 9° inclusive, and still more preferably 8°.

At the electron beam irradiation step S23, the irradiation with the electron beam PE is preferably performed at an acceleration voltage of 1.0 kV or less. By making the electron beam PE incident on the SiC substrate 10 at such an acceleration voltage, it is possible to acquire the image I reflecting the contrast information C.

The image I is created on the basis of electrons (reflected electrons) obtained when the electron beam PE (primary electrons) emitted by an electron emission unit of the scanning electron microscope is bounced back on the surface of the SiC substrate 10, or emitted after the electron beam PE interacts with the SiC substrate 10, and electrons (secondary electrons) generated during the interaction.

That is, a detector disposed in the scanning electron microscope detects the reflected electrons and/or the secondary electrons, and the image I is created on the basis of positional information of the SiC substrate 10 and the detection results of the respective electrons.

Figure 6:
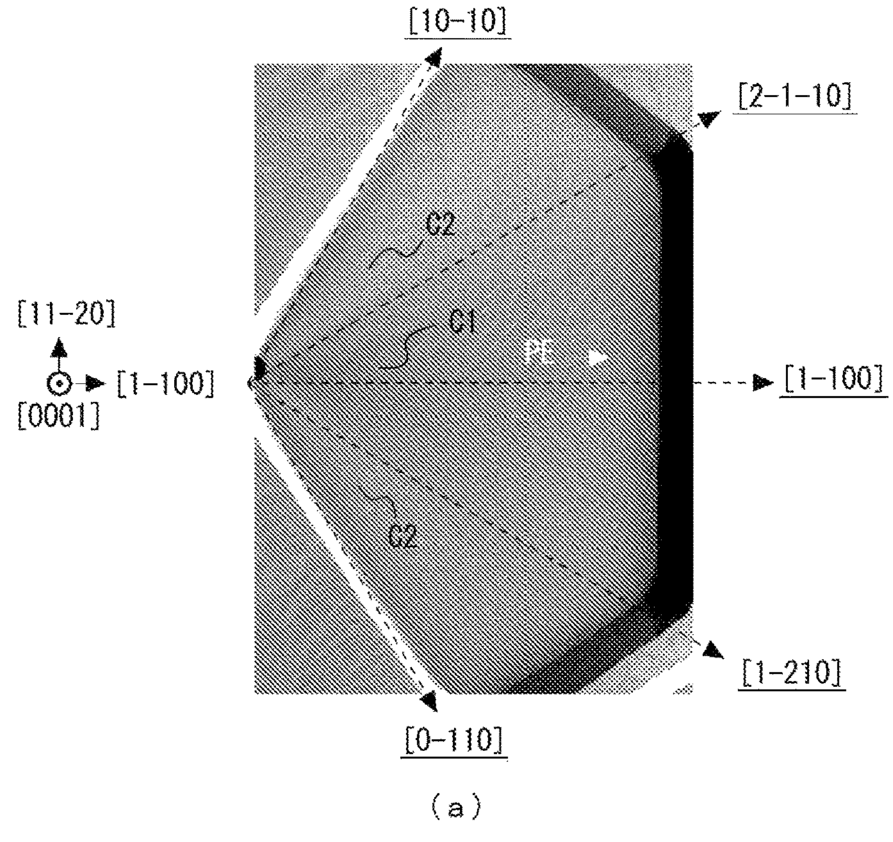
FIG. 6 is a drawing illustrating an image acquisition step according to the embodiment.
Figure 6:
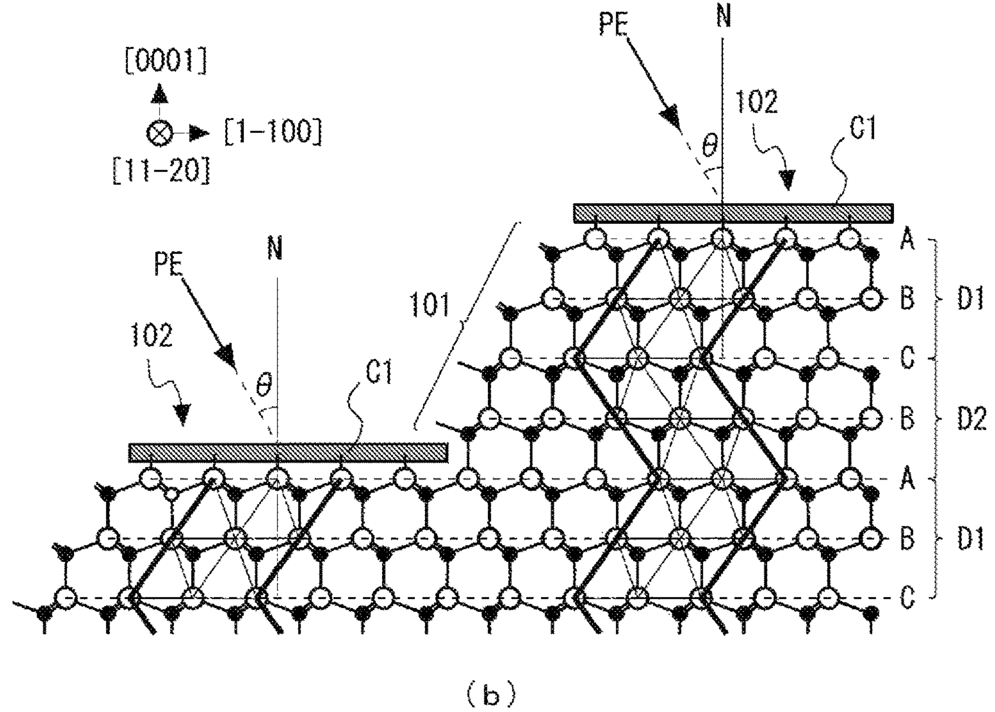

FIG. 6 is an explanatory view illustrating the image I obtained at the image acquisition step S20 for the SiC substrate 10 heat-treated in the Si—SiC equilibrium vapor pressure environment (the heat treatment environment HE) at the heat treatment step S10. FIG. 6(*a*) is the image I of the SiC substrate 10 heat-treated in the Si—SiC equilibrium vapor pressure environment. FIG. 6(*b*) is a schematic view of the crystal structure of the SiC substrate 10 heat-treated in the Si—SiC equilibrium vapor pressure environment.

Figure 7:
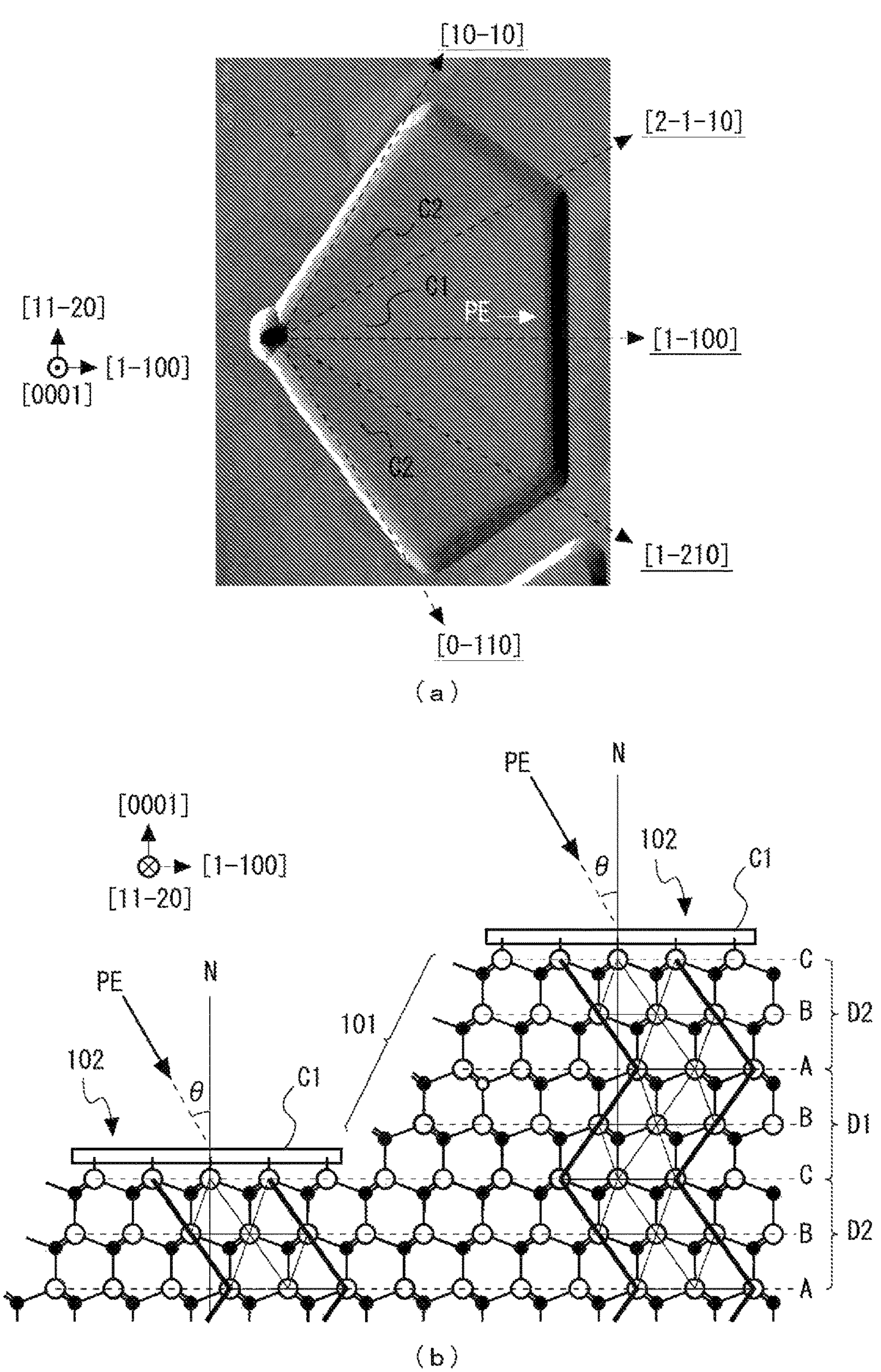
FIG. 7 is a drawing illustrating the image acquisition step according to the embodiment.

FIG. 7 is an explanatory view illustrating the image I obtained at the image acquisition step S20 for the SiC substrate 10 heat-treated in the C—SiC equilibrium vapor pressure environment (the heat treatment environment HE) at the heat treatment step S10. FIG. 7(*a*) is the image I of the SiC substrate 10 heat-treated in the C—SiC equilibrium vapor pressure environment. FIG. 7(*b*) is a schematic view of the crystal structure of the SiC substrate 10 heat-treated in the C—SiC equilibrium vapor pressure environment.

<Environment Evaluation Step>

The environment evaluation step S30 is a step of evaluating the heat treatment environment HE of the SiC substrate 10 on the basis of the contrast information C of the image I. The environment evaluation step S30 is a step of evaluating the contrast information C appearing on the terrace 102 of the SiC substrate 10. In particular, the environment evaluation step S30 is a step of evaluating the contrast information C appearing along the <1-100> direction.

The contrast information C includes the plurality of pieces of brightness information reflecting the stacking direction of the atoms on the surface of the SiC substrate 10. Specifically, the contrast information C includes first brightness information C1 appearing along the <1-100> direction and second brightness information C2 capable of being compared with the first brightness information C1.

The environment evaluation step S30 includes a brightness comparison step S31 of comparing the plurality of pieces of brightness information, and a crystal structure specification step S32 of specifying the crystal structure of the outermost surface (the terrace 102) of the SiC substrate 10 on the basis of the plurality of pieces of brightness information.

The brightness comparison step S31 is a step of comparing the plurality of pieces of brightness information. Specifically, the brightness comparison step S31 is a step of evaluating whether the first brightness information C1 appearing along the <1-100> direction is white or black by comparing the brightness of the first brightness information C1 with the brightness of the second brightness information C2. That is, the plurality of pieces of brightness information are compared to evaluate whether the area of the terrace 102 used for evaluation is relatively black or white at this step.

The crystal structure specification step S32 is a step of obtaining information regarding the crystal structure of the outermost surface (the terrace 102) of the SiC substrate 10 from a relationship between the first brightness information C1 obtained at the brightness comparison step S31 and the inclination direction of the incident angle θ of the electron beam PE (the incident direction of the electron beam PE) with respect to the SiC substrate 10.

For example, in FIG. 5, in a case where the electron beam PE is incident on the terrace 102 where the atoms are stacked in a first stacking direction D1 (a direction in which the Si atoms are stacked in the order of C→B→A), the black contrast information C is obtained. In a case where the electron beam PE is incident on the terrace 102 where the atoms are stacked in a second stacking direction D2 (a direction in which the Si atoms are stacked in the order of A→B→C), the white contrast information C is obtained.

That is, when the relationship between the contrast information C of the image I and the incident direction of the electron beam PE with respect to the SiC substrate 10 is obtained, it is possible to specify whether the stacking direction of the atoms of the terrace 102 is the first stacking direction D1 or the second stacking direction D2.

Hereinafter, the brightness comparison step S31 and the crystal structure specification step S32 will be described in detail with reference to FIGS. 6 and 7.

FIG. 6 is the image I acquired by irradiating the SiC substrate 10 heat-treated in the Si—SiC equilibrium vapor pressure environment, with the electron beam PE from a [−1100] direction (a left-side direction in FIG. 6).

At this time, it can be grasped that the first brightness information C1 appearing on the terrace 102 in a [1-100]

direction of the image I is black by comparison with the second brightness information C2 (the brightness comparison step S31). The second brightness information C2 compared with the first brightness information C1 appears to be white in an area between a [10-10] direction and a [2-1-10] direction, for example.

In FIG. 6, in order for an area corresponding to the first brightness information C1 to become black when irradiated with the electron beam PE from the [−1100] direction, the crystal structure of the outermost surface of the SiC substrate 10 needs to be stacked in the first stacking direction D1 (the crystal structure specification step S32).

That is, since the first brightness information C1 of the SiC substrate 10 heat-treated in the Si—SiC equilibrium vapor pressure environment illustrated in FIG. 6 is black, the stacking direction of the atoms of the terrace 102 in the [1-100] direction can be evaluated to be the first stacking direction D1. In addition, as illustrated in FIG. 6(*b*), the terrace 102 of the SiC substrate 10 heat-treated in the Si—SiC equilibrium vapor pressure environment can be evaluated to form a surface where a C element having two dangling bonds is present at the end of the step 101 in the <1-100> direction.

In other words, at the crystal structure specification step S32, in a case where the SiC substrate 10 has the surface where the C element having two dangling bonds is present at the end of the step 101 in the <1-100> direction, the heat treatment environment experienced by the SiC substrate 10 can be evaluated to be the Si—SiC equilibrium vapor pressure environment.

In FIG. 6, in a case where the irradiation with the electron beam PE is performed from the [1-100] direction (a right-side direction in the drawing) under the conditions of the same substrate and the same inclination angle, the contrast information C is reversed. That is, the first brightness information C1 reflecting the crystal structure in the first stacking direction D1 is white, and the second brightness information C2 reflecting the crystal structure in the second stacking direction D2 is black.

As described above, the contrast information C (the first brightness information C1 and the second brightness information C2) is determined by the relationship between the irradiation direction of the electron beam PE and the stacking direction of the SiC substrate 10. Therefore, at the crystal structure specification step S32, it is necessary to evaluate the stacking direction of the area of the first brightness information C1 from the crystal structure of the SiC substrate 10 and the direction irradiated with the electron beam PE.

FIG. 7 is the image I acquired by irradiating the SiC substrate 10 heat-treated in the C—SiC equilibrium vapor pressure environment, with the electron beam PE from the [−1100] direction (the left-side direction in the drawing).

At this time, it can be grasped that the first brightness information C1 appearing on the terrace 102 in the [1-100] direction of the image I is white by comparison with the second brightness information C2 (the brightness comparison step S31). The second brightness information C2 compared with the first brightness information C1 appears to be black in the area between the [10-10] direction and the [2-1-10] direction, for example.

In FIG. 7, in order for the area corresponding to the first brightness information C1 to become white when irradiated with the electron beam PE from the [−1100] direction, the crystal structure of the outermost surface of the SiC substrate 10 needs to be stacked in the second stacking direction D2 (the crystal structure specification step S32).

That is, since the first brightness information C1 of the SiC substrate 10 heat-treated in the C—SiC equilibrium vapor pressure environment illustrated in FIG. 7 is white, the stacking direction of the atoms of the terrace 102 in the [1-100] direction can be evaluated to be the second stacking direction D2. In addition, as illustrated in FIG. 7(*b*), the terrace 102 of the SiC substrate 10 heat-treated in the C—SiC equilibrium vapor pressure environment can be evaluated to form a surface where a C element having one dangling bond is present at the end of the step 101 in the <1-100> direction.

In other words, at the crystal structure specification step S32, in a case where the SiC substrate has the surface where the C element having one dangling bond is present at the end of the step 101 in the <1-100> direction, the heat treatment environment experienced by the SiC substrate 10 can be evaluated to be the C—SiC equilibrium vapor pressure environment.

In FIG. 7, in a case where the irradiation with the electron beam PE is performed from the [1-100] direction (the right-side direction in the drawing) under the conditions of the same substrate and the same inclination angle, the first brightness information C1 is black and the second brightness information C2 is white.

The method for evaluating a heat treatment environment according to the present invention includes: the image acquisition step S20 of acquiring the image I by making the electron beam PE incident at the incident angle θ inclined with respect to the normal line N of the {0001} plane of the heat-treated SiC substrate 10; and the environment evaluation step S30 of evaluating the heat treatment environment HE of the SiC substrate 10 on the basis of the contrast information C of the image I.

In the method for evaluating a heat treatment environment according to the present invention, the stacking direction of the atoms of the terrace 102 reflecting the heat treatment environment HE is evaluated. Therefore, the heat treatment environment HE can be evaluated without being locally affected by crystal defects, a subsurface damaged layer, and the like of the SiC substrate 10.

In addition, in the method for evaluating a heat treatment environment according to the present invention, it is possible to evaluate the heat treatment environment HE easily only by acquiring the image I of the SiC substrate 10 using the scanning electron microscope. That is, as illustrated in FIGS. 6 and 7, whether the heat treatment environment HE is the Si—SiC equilibrium vapor pressure environment or the C—SiC equilibrium vapor pressure environment can be evaluated on the basis of the contrast information C of the image I.

<<SiC Substrate>>

Next, a preferred embodiment of the SiC substrate used in the above-described method for evaluating a heat treatment environment will be described.

Figure 8:
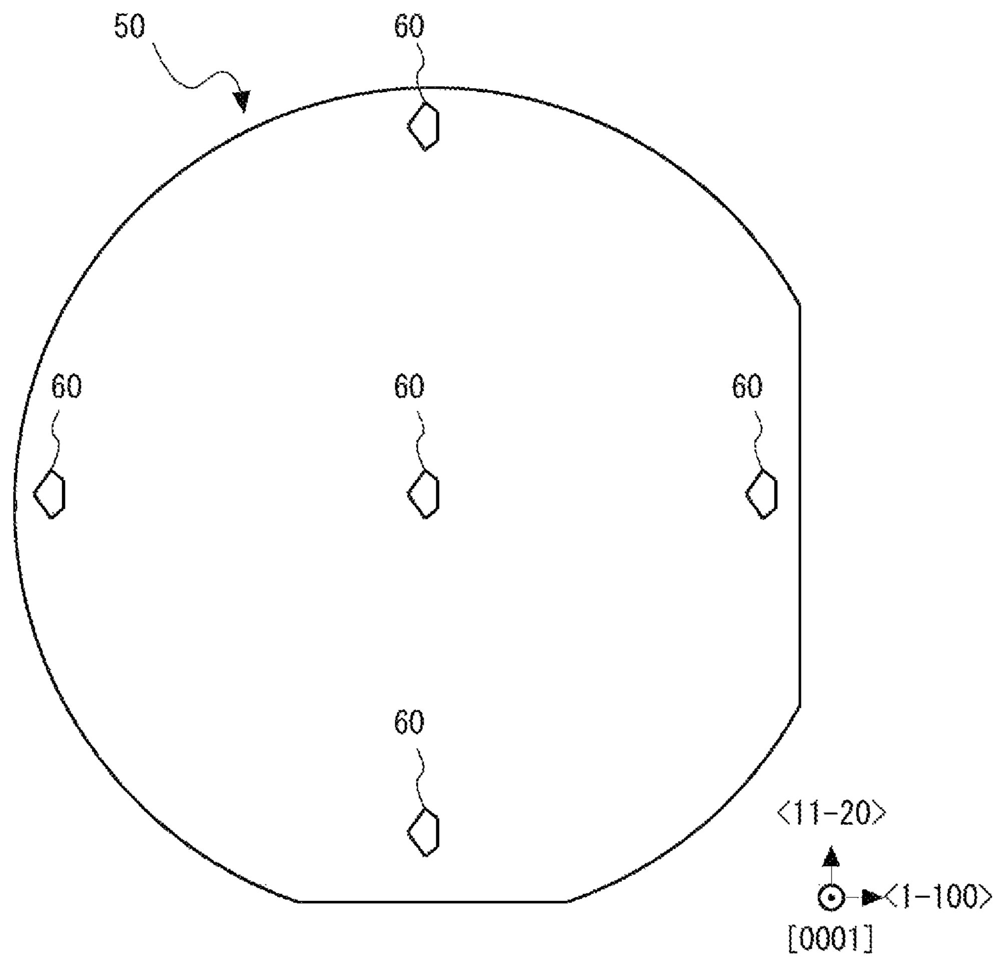
FIG. 8 is a drawing illustrating a SiC substrate according to the embodiment.

As illustrated in FIG. 8, a SiC substrate 50 has an evaluation pattern 60 for evaluating the heat treatment environment HE. The evaluation pattern 60 includes a step formation portion 61 that serves as a generation source of the step 101 during the heat treatment, and an environment evaluation area 62 where the step-terrace structure resulting from the step formation portion 61 is formed.

FIG. 8 illustrates an example in which a plurality of the evaluation patterns 60 are formed on a SiC wafer. By interspersing the SiC wafer with the evaluation patterns 60 as described above, it is possible to evaluate the heat treatment environment HE at each location.

However, the size and shape of the SiC substrate 50 and the number of evaluation patterns 60 are not limited. For example, an individual piece where one evaluation pattern 60 is formed may be adopted as an evaluation sample of the heat treatment environment HE.

Figure 9:
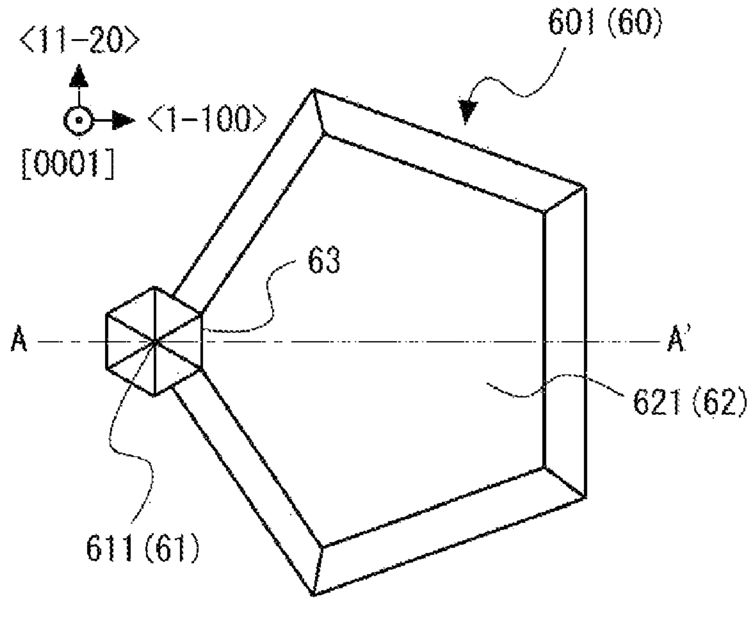
FIG. 9 is a drawing illustrating the SiC substrate according to the embodiment.
Figure 9:
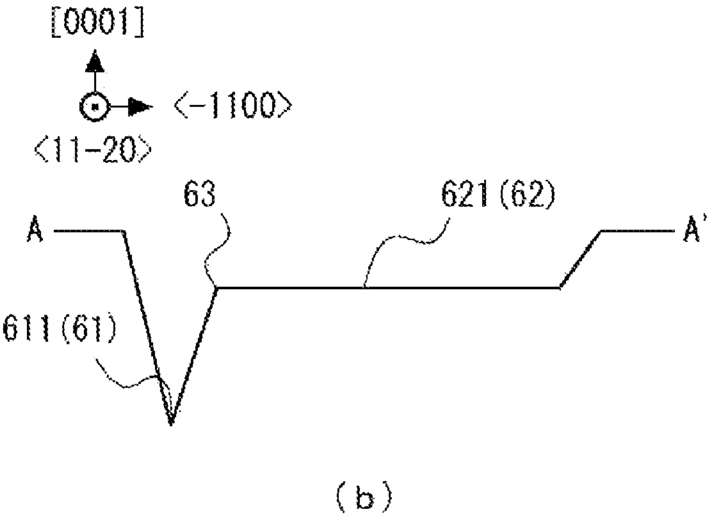

FIG. 9 is an example of the evaluation pattern 60, which includes a machined hole 611 serving as the step formation portion 61 and a machined recess 621 serving as the environment evaluation area 62.

Since the machined hole 611 is formed deeper than the machined recess 621, a cliff portion 63 is formed between the machined hole 611 and the machined recess 621. When the heat treatment is performed in the heat treatment environment HE, etching preferentially proceeds from the cliff portion 63. Therefore, the terrace 102 reflecting the heat treatment environment HE is formed in an area inside the machined recess 621.

Figure 10:
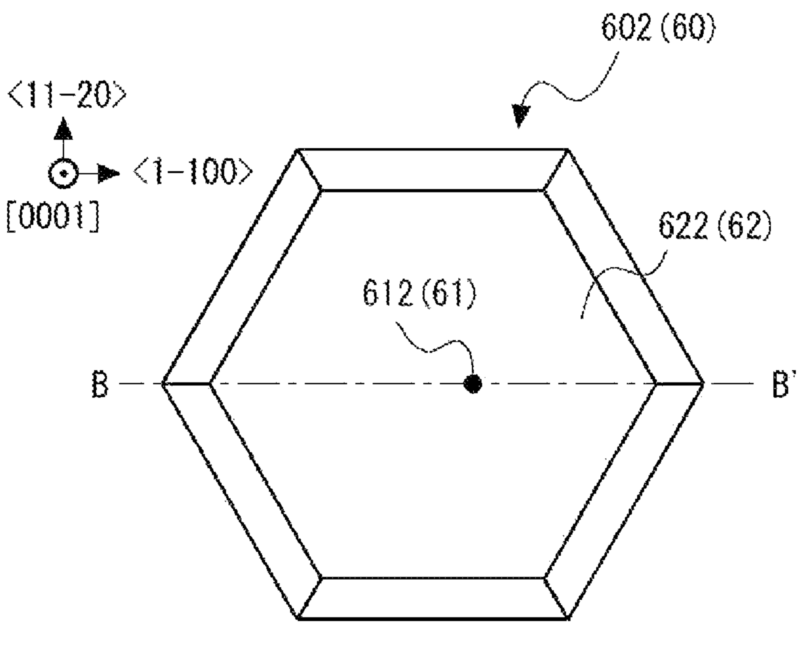
FIG. 10 is a drawing illustrating the SiC substrate according to the embodiment.
Figure 10:
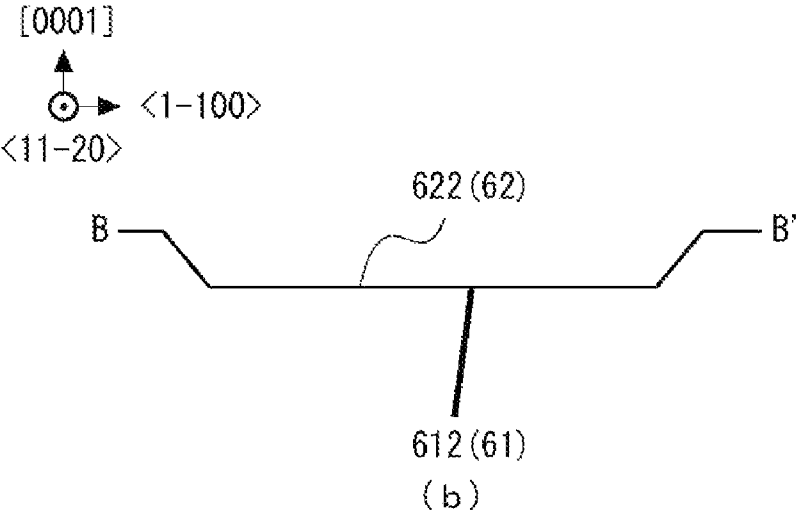

FIG. 10 is an example of the evaluation pattern 60, which includes a threading dislocation 612 serving as the step formation portion 61 and a machined recess 622 serving as the environment evaluation area 62.

A threading edge dislocation or a threading screw dislocation as the threading dislocation 612 is preferentially grown or etched when the heat treatment is performed in the heat treatment environment HE. Therefore, the terrace 102 reflecting the heat treatment environment HE is formed in an area inside the machined recess 622.

The SiC substrate 50 according to the present invention includes the step formation portion 61 that serves as the generation source of the step 101 during the heat treatment, and the environment evaluation area 62 where the step-terrace structure resulting from the step formation portion 61 is formed.

By heat-treating the SiC substrate 10 including the step formation portion 61 and the environment evaluation area 62 in the heat treatment environment HE, it is possible to obtain the terrace 102 reflecting the heat treatment environment HE. By evaluating the SiC substrate by the above-described method for evaluating a heat treatment environment, it is possible to evaluate the heat treatment environment HE appropriately.

REFERENCE SIGNS LIST

10, 50 SiC substrate
101 Step
102 Terrace
20 SiC material
30 Heat treatment container
31 Upper container
32 Lower container
33 Gap
34 Holder
35 Si-vapor supply source
40 Refractory material container
41 Upper container
42 Lower container
43 Gap
44 Si-vapor supply source
45 Evaluation pattern
61 Step formation portion
611 Machined hole
612 Threading dislocation
62 Environment evaluation area
621 Machined recess
622 Machined recess
S10 Heat treatment step
S20 Image acquisition step
S30 Environment evaluation step
C Contrast information
C1 First brightness information
C2 Second brightness information
HE Heat treatment environment
PE Electron beam

The invention claimed is:

1. A method for evaluating a heat treatment environment, the method comprising:

a heat treatment step of heat treating a silicon carbide substrate in a heat treatment container including polycrystal SiC;

an image acquisition step of acquiring an image by making an electron beam incident at an incident angle inclined with respect to a normal line of a {0001} plane of the heat-treated silicon carbide substrate; and an environment evaluation step of evaluating a heat treatment environment of the silicon carbide substrate on a basis of contrast information of the image, wherein the image acquisition step is a step of making the electron beam incident on the silicon carbide substrate, the electron beam being inclined to the <1-100> direction, and wherein the environment evaluation step is a step of evaluating that the heat treatment environment is a Si—SiC equilibrium vapor pressure environment or a C—SiC equilibrium vapor pressure environment.

2. The method for evaluating a heat treatment environment according to claim 1, wherein the environment evaluation step is a step of evaluating the contrast information appearing on a terrace.

3. The method for evaluating a heat treatment environment according to claim 1, wherein the environment evaluation step is a step of evaluating the contrast information appearing along a <1-100> direction.

4. The method for evaluating a heat treatment environment according to claim 1, wherein the contrast information includes a plurality of pieces of brightness information reflecting a stacking direction of atoms, and the environment evaluation step includes a brightness comparison step of comparing the plurality of pieces of brightness information.

5. The method for evaluating a heat treatment environment according to claim 1, wherein the contrast information includes first brightness information reflecting the stacking direction of atoms and second brightness information capable of being compared with the first brightness information, and the environment evaluation step includes the brightness comparison step of comparing the first brightness information with the second brightness information.

6. The method for evaluating a heat treatment environment according to claim 1, wherein the silicon carbide substrate has a hexagonal crystal structure.

7. The method for evaluating a heat treatment environment according to claim 1, the method comprising a heat treatment step of forming a step-terrace structure by heat-treating the silicon carbide substrate in the heat treatment environment.

8. The method for evaluating a heat treatment environment according to claim 1, wherein the silicon carbide substrate includes a step formation portion that serves as a generation source of a step during heat treatment, and an environment evaluation area where the step-terrace structure resulting from the step formation portion is formed, and the environment evaluation step is a step of evaluating the environment evaluation area.

9. The method for evaluating a heat treatment environment according to claim 8, wherein the step formation portion is a threading dislocation.

10. The method for evaluating a heat treatment environment according to claim 8, wherein the step formation portion is a machined hole.

11. The method for evaluating a heat treatment environment according to claim 8, wherein the environment evaluation area is a machined recess.

* * * * *